US010354632B2

(12) United States Patent
Deif

(10) Patent No.: US 10,354,632 B2
(45) Date of Patent: Jul. 16, 2019

(54) SYSTEM AND METHOD FOR IMPROVING SINGING VOICE SEPARATION FROM MONAURAL MUSIC RECORDINGS

(71) Applicant: Abu Dhabi University, Abu Dhabi (AE)

(72) Inventor: Hatem Mohamed Deif, Abu Dhabi (AE)

(73) Assignee: ABU DHABI UNIVERSITY, Abu Dhabi (AE)

( * ) Notice: Subject to any disclaimer, the term of this patent is extended or adjusted under 35 U.S.C. 154(b) by 0 days.

(21) Appl. No.: 16/002,367

(22) Filed: Jun. 7, 2018

(65) Prior Publication Data

US 2019/0005934 A1 Jan. 3, 2019

Related U.S. Application Data

(60) Provisional application No. 62/525,915, filed on Jun. 28, 2017.

(51) Int. Cl.
*H03F 1/26* (2006.01)
*G10H 1/36* (2006.01)

(52) U.S. Cl.
CPC ....... *G10H 1/366* (2013.01); *G10H 2210/056* (2013.01); *G10H 2210/066* (2013.01); *G10H 2250/101* (2013.01); *G10H 2250/215* (2013.01)

(58) Field of Classification Search
CPC ............ G10H 1/366; G10H 2210/066; G10H 2250/101; G10H 2210/056; G10H 2250/215
USPC ........................................................ 84/621
See application file for complete search history.

(56) References Cited

U.S. PATENT DOCUMENTS

2006/0204019 A1* 9/2006 Suzuki ................ G10L 21/0272 381/92
2006/0215854 A1* 9/2006 Suzuki ................ G10L 21/0272 381/98
2013/0064379 A1* 3/2013 Pardo ........................ H04S 7/40 381/56
2017/0140745 A1* 5/2017 Nayak .................. H04L 65/605

* cited by examiner

*Primary Examiner* — Jeffrey Donels
(74) *Attorney, Agent, or Firm* — Hayes Soloway PC

(57) ABSTRACT

There is provided a post processing technique or method for separation algorithms to separate vocals from monaural music recordings. The method comprises detecting traces of pitched instruments in a magnitude spectrum of a separated voice using Hough transform and removing the detected traces of pitched instruments using median filtering to improve the quality of the separated voice and to form a new separated music signal. The method further comprises applying adaptive median filtering techniques to remove the identified Hough regions from the vocal spectrogram producing separated pitched instruments harmonics and new vocals while adding the separated pitched instruments harmonics to a music signal separated using any separation algorithm to form the new separated music signal.

6 Claims, 5 Drawing Sheets

SYSTEM AND METHOD FOR IMPROVING SINGING VOICE SEPARATION FROM MONAURAL MUSIC RECORDINGS

CROSS REFERENCE TO RELATED APPLICATION

This application claims benefit of U.S. Provisional Application Ser. No. 62/525,915, entitled, "System and Method for Improving Singing Voice Separation from Monaural Music Recordings" filed Jun. 28, 2017, the entire disclosure of which is incorporated herein by reference.

FIELD OF THE INVENTION

The present invention relates to the field of processing music recordings, and more particularly, a post processing technique for separation algorithms to separate vocals from monaural music recordings.

BACKGROUND OF THE INVENTION

Music recordings are composed mainly of two predominant components—the vocals or the singing voice and the instruments. Of these two components, the instruments are usually a combination of pitched and percussion instruments. Vocals separation or singing voice separation from polyphonic music (consisting of two or more simultaneous lines of independent melodies, in contrast to monophony—a musical texture with just one melody is a challenging problem, which attracted much attention recently owing to its multiple useful applications.

In music information retrieval (MIR) systems, vocals separation is useful in singer language identification, lyrics recognition and alignment, and melody extraction and transcription. In addition to its importance for MIR applications, separation of vocals could have many other benefits, such as in adjusting the vocal pitch, audio remixing, and creating a vocal or non-vocal equalizer for use in automatic karaoke applications.

However on examining traditional separation techniques employed, one can still hear harmonics of pitched instruments in the separated vocal tracks. The difficulty of the problem arises from the similarity between vocals and musical instruments since the spectra of both have harmonic structure. In addition, music instruments do not possess whiteness and stationarity properties of noise and thus cannot be separated by noise suppression techniques.

On experimenting with various traditional separation techniques and a variety of musical recordings, pitched instruments are still audible in the separated vocals. Harmonics of pitched instruments appear as horizontal ridges in a mixture spectrogram, and additional horizontal ridges representing harmonics of pitched instruments were available in all outcomes of traditional separation algorithms, in different proportions.

Accordingly, there exists a need to provide a methodology or processing technique to target pitched instruments harmonics and separate the same from separated vocal track regardless of the separation algorithm used.

SUMMARY OF THE INVENTION

Therefore it is an object of the present invention to provide a method for improving singing voice separation from monaural music recordings, or in other words, a post processing technique for separation algorithms to separate vocals from monaural music recordings.

The present invention involves a method for improving singing voice separation from monaural music recordings, the method comprising of detecting traces of pitched instruments in a magnitude spectrum of a separated voice using Hough transform and removing the detected traces of pitched instruments using adaptive median filtering to improve the quality of the separated voice and to form a new separated music signal.

In an embodiment of the present invention, the method further comprises generating the magnitude spectrogram of a mixture signal, converting the magnitude spectrogram to a grey scale image, applying a plurality of binarization steps to the grey scale image to generate a final binary image, applying Hough transform to the final binary image, identifying horizontal ridges represented by Hough lines and calculating variable frequency bands of the identified horizontal ridges, calculating rectangular regions denoted here as Hough regions. Meanwhile, the method comprises generating a vocal spectrogram from vocal signals separated using any separation algorithm.

The method further includes applying adaptive median filtering techniques to remove the identified Hough regions from the vocal spectrogram producing separated pitched instruments harmonics and a new vocal spectrogram. Then the method adds the separated pitched instruments harmonics to a music signal separated using any separation algorithm to form the new separated music signal.

In another embodiment, the binarization steps are performed through a combination of global and local thresholding techniques followed by extraction of peak time frames.

In another embodiment, the method for improving singing voice separation works as a post-processing step that may be applied to any separation algorithm.

In a further aspect of the present invention, a system for improving singing voice separation from monaural music recordings is proposed, wherein the system comprises a microprocessor for detecting traces of pitched instruments in a magnitude spectrum of a separated voice using Hough transform and removing the detected traces of pitched instruments using median filtering to improve the quality of the separated voice and to form a new separated music signal.

In an embodiment, the system further comprises generating a magnitude spectrogram of a mixture signal, converting the magnitude spectrogram to a grey scale image, applying a number of binarization steps to the grey scale image to generate a final binary image, implementing Hough transform to the final binary image, identifying horizontal ridges represented by Hough lines and calculating variable frequency bands of the identified horizontal ridges, calculating rectangular regions denoted here as Hough regions and generating a vocal spectrogram from vocal signals separated using any separation algorithm.

The system further comprises applying adaptive median filtering techniques to remove the identified Hough regions from the vocal spectrogram producing separated pitched instruments harmonics and new vocals harmonics and adding the separated pitched instruments harmonics to a music signal separated using any separation algorithm to form the new separated music signal.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which—

DETAILED DESCRIPTION OF THE INVENTION

The aspects of the method or system for improving singing voice separation from monaural music recordings according to the present invention will be described in conjunction with FIGS. 1-7. In the Detailed Description, reference is made to the accompanying figures, which form a part hereof, and in which is shown by way of illustration specific embodiments in which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

Figure 1:
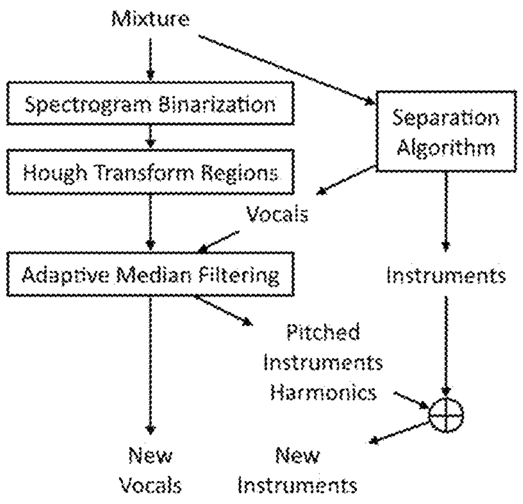
FIG. 1 is a block diagram demonstrating the main steps in the proposed post-processing system for removing pitched instruments harmonics.

The proposed post-processing system makes use of both a mixture signal and vocals separated from any reference separation algorithm. Firstly, a magnitude spectrogram of the mixture signal is used to generate a binary image that is necessary for operation of Hough Transforms. Secondly, Hough transform is applied on the binary image generating a plurality of horizontal lines that represent pitched instruments harmonics. The bandwidth of these instrument harmonics are then determined to form rectangular regions denoted as Hough Regions. Finally, the formed Hough Regions are then removed from the magnitude spectrogram of the vocals separated from the reference separation algorithm using an adaptive median filtering technique. The removed pitched instrument harmonics are then added to the instruments separated from the reference separation algorithm. FIG. 1 denotes the proposed post-processing system. FIG. 1 is a block diagram demonstrating the main steps in the proposed post-processing system for removing pitched instruments harmonics. As depicted in the block diagram, from the input mixture signal, after the process, a new vocal and new instruments signals are obtained.

Figure 2:
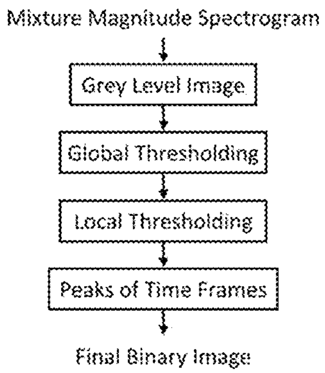
FIG. 2 is a block diagram demonstrating multiple steps in obtaining the binary image from the mixture magnitude spectrogram.

In accordance with an embodiment of the present invention, the first step includes calculating a complex spectrogram $\hat{S}$ from the mixture signal s using a window size and an overlap ratio that are suitable for this procedure and independent of the parameters used in the reference separation algorithm. Following this, the magnitude spectrogram S is obtained as a I×J matrix where the value at $i^{th}$ row and $j^{th}$ column is represented using Cartesian coordinates as S(x, y), where x=j and y=i. Then the magnitude spectrogram S is converted to a grey-scale image $G_1(x, y)$ whose scale is [0,1]. This is followed by a number of binarization steps as denoted in FIG. 2 in order to obtain a final binary image. On experimentation of different binarization techniques, it is discovered that parts of the spectrogram were better represented by a binary image obtained via global thresholding whereas other parts were better represented by local thresholding. Hence, best results are obtained on combining global and local thresholding. FIG. 2 is a block diagram demonstrating multiple steps in obtaining the binary image from the mixture magnitude spectrogram.

A new grey-level image $G_2(x, y)$ is obtained using a global threshold, $T_g$ as shown in equation (1):

$$G_2(x, y) = \begin{cases} G_1(x, y) & \text{if } G_1(x, y) \geq T_g \\ 0 & \text{otherwise} \end{cases} \quad (1)$$

Figure 3:
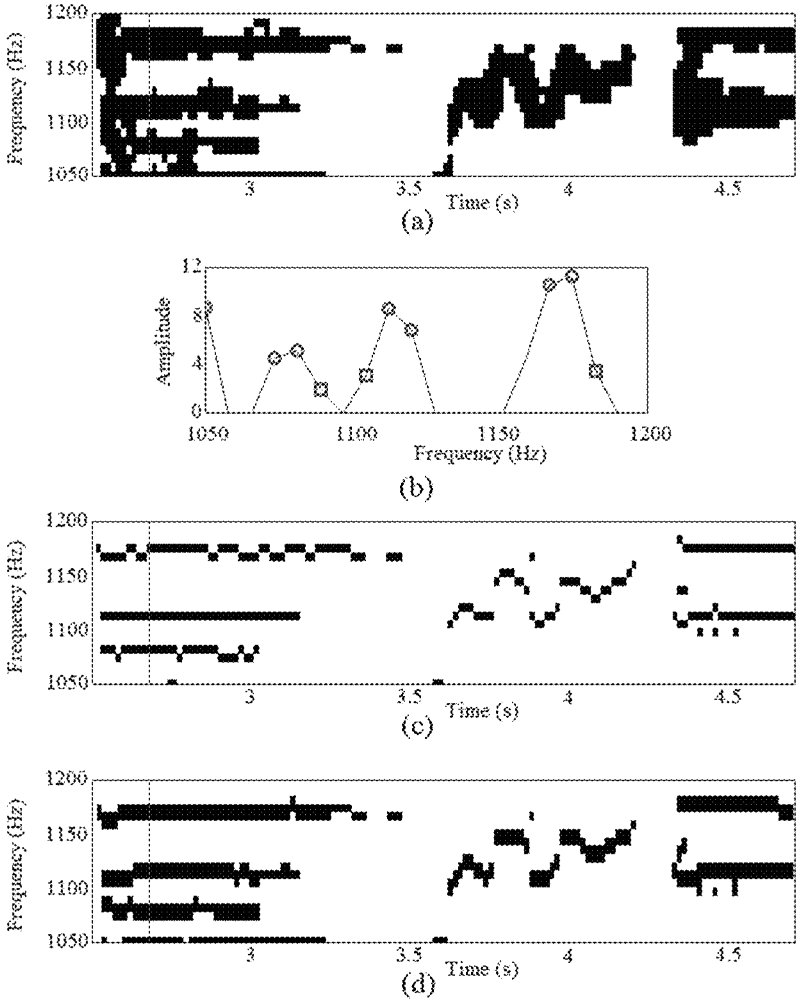
FIG. 3 displays the process of generating a final binary image from the magnitude spectrogram.

Following this step, Bernsen local thresholding is applied on the new gray-level image $G_2(x, y)$ to get a first binary image $B_1(x, y)$ as denoted by equations (2) and (3):

$$B_1(x, y) = \begin{cases} 1 & \text{if } G_2(x, y) \geq T_b(x, y) \\ 0 & \text{otherwise} \end{cases} \quad (2)$$

$$T_b(x, y) = \frac{g_{low}(x, y) + g_{high}(x, y)}{2} \quad (3)$$

wherein $g_{low}(x, y)$ and $g_{high}(x, y)$ are the minimum and maximum grey level values within a rectangular M×N window centred at the point (x, y). An example of the binary image $B_1(x, y)$ obtained by global and local thresholding is shown in FIG. 3 (*a*). FIG. 3 generally displays the process of generating a final binary image from the magnitude spectrogram.

On applying Hough transform on the binary image $B_1(x, y)$, plurality of horizontal lines were generated inside many of the vocal segments. In order to overcome this problem, it was required to have a representation to emphasize the horizontal nature of pitched instrument harmonics. For this purpose $B_1$ is used as a mask which is applied on the magnitude spectrogram S to generate a new magnitude spectrogram $S_1$.

$$S_1=B_1 \otimes S \quad (4)$$

wherein ⊗ represents element-wise multiplication. Following this step, matrix $S_1$ is represented as a row of J column vectors representing the spectra of all J time frames. The same is assumed for final binary image $B_2$.

$$S_1=[s_1,s_2, \ldots ,s_j, \ldots ,s_J] \quad (5)$$

$$B_2=[b_1,b_2, \ldots b_j, \ldots ,b_J] \quad (6)$$

Peaks of the magnitude spectrum for each column $s_j$ are then calculated using the “findpeaks” function of MATLAB. Each of these peaks sets a value of 1 in the column vector $b_j$ of the new binary image $B_2$ while all other values are set to 0. FIG. 3 (*b*) displays a segmented example of $s_j$.

However, as shown in FIG. 3 (*c*), some pitched instruments harmonic displayed peak points fluctuating up and down between adjacent time frames. In order to facilitate the generation of horizontal lines by Hough transform for the upcoming stage of the present invention, each displayed peak is represented by two adjacent points. The second point is chosen as the one before or after the main peak point based on whichever point has a higher value of the magnitude spectrum. An example of this result is shown in FIG. 3 (*d*). The following algorithm calculates the final binary image $B_2$ from the magnitude spectrogram $S_1$ in detail.

Figure 4:
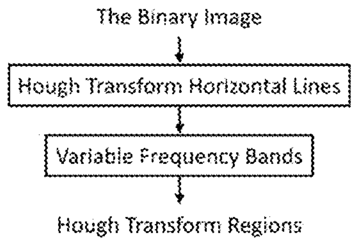
FIG. 4 represents the main steps in obtaining Hough transform regions.

Input: The spectrogram $S_1$ with I rows (frequency bins) and J columns (time frames)
Output: The final binary image $B_2$
$B_2$ ← All zeros I×J matrix for each column $j \in \{1 \ldots J\}$
  f=Locations of all K peaks in $s_j$ for each location $f_k$
  $b_j(f_k)=1$
  if $s_j(f_k+1)>s_j(f_k-1)$
    $b_j(f_k+1)=1$
  else
    $b_j(f_k-1)=1$
  end if
  end for
end for Following this step, locations of pitched instruments harmonics that appear as horizontal ridges in the mixture magnitude spectrogram are identified. This process is conducted in two steps. Initially, Hough transform is applied on the binary image $B_2$ generated from the mixture magnitude spectrogram S to obtain the plurality of horizontal lines. Subsequent to this, variable frequency bands of these horizontal ridges are calculated using the lowest point between neighboring horizontal ridges, resulting in Hough transform regions. FIG. 4 represents the main steps in obtaining Hough transform regions.

Hough transform is based on the fact that a line in the Cartesian coordinate system (Image space) can be mapped onto a point in the rho-theta space (Hough space) using parametric representation of a line making it clear that a point in the Hough space represents a line in the Image space.

$$\rho = x \cos \theta + y \sin \theta \tag{7}$$

Conversely, if rho and theta are the variables in the equation above, then each pixel (x, y) in the image is represented by a sinusoidal curve in the rho-theta space. In order to find the value of ρ, θ corresponding to a specific line in the image (x, y plane), equation (7) is used to draw the sinusoidal curve for each point in the line. Hence, considering that there is present a binary image that consists of one line, and the sinusoidal curve for every non-zero point in the image is graphed, then the actual ρ and θ coordinate of the line will be reinforced by all graphed sinusoidal curves on the rho-theta plane. This is a single Hough peak.

An image with multiple lines will generate multiple peaks in Hough space. In an embodiment of the present invention, in order to obtain the horizontal lines from the binary image $B_2$, the "hough" function in MATLAB is used to construct the Hough space, followed by the "houghpeaks" function to generate the peaks in the Hough space. Further, line segments are extracted using the "houghlines" function, and only horizontal lines with a certain minimum length are maintained. The result is a set of Q horizontal lines wherein each line $l^q$ is defined by the left and right points $(x_1, y_0)$ and $(x_2, y_0)$ respectively.

The next step involves estimation of variable frequency bands. The variable frequency bands of the horizontal ridges represented by the Hough lines are estimated using the y-coordinate of the point that has the lowest magnitude spectrum value between two adjacent ridges. The following algorithm provides details of obtaining lower frequency $y_1$ and the upper frequency $y_2$ for each line (denoted by l for simplicity), or details regarding estimating the frequency band of a horizontal ridge represented by a horizontal line.

---

Inputs: The magnitude spectrogram S and a single Hough line l defined by $\{x_1, x_2, y_o\}$
Output: The line frequency band $\{y_1, y_2\}$
1- Calculate $x_o = (x_1 + x_2)/2$
2- Starting from $(x_o, y_o)$, decrease y gradually in search for $(x_o, y_1)$ such that:
  i- $S(x_o, y-1) \leq S(x_o, y),\ y \in (y_1, y_0]$
  ii- $S(x_o, y_1 - 1) > S(x_o, y_1)$
3- Similarly, starting from $(x_o, y_o)$, increase y gradually in search for $(x_o, y_2)$ such that:
  i- $S(x_o, y+1) \leq S(x_o, y),\ y \in [y_o, y_2)$
  ii- $S(x_o, y_2 + 1) > S(x_o, y_2)$

---

Following this step is a technique of Adaptive median Filtering. Till this point, a rectangular region $r^q = \{x_1^q, x_2^q, y_1^q, y_2^q\}$ is calculated around each horizontal line $l^q$ that represents the $q^{th}$ harmonic segment that presumably belongs to a pitched instrument in the mixture spectrogram. It is now required to remove these regions from the vocals separated from the reference separation algorithm to refine it further from the pitched instruments. Initially, the complex spectrogram $\hat{S}_v$ of the separated vocals signal $s_v$ is calculated using the same window size and the overlap ratio that were used to calculate the mixture spectrogram $\hat{S}$. In order to remove Hough Regions from the magnitude spectrogram $S_v$, an Adaptive Median Filtering technique is used which is depicted in FIG. 5 as two main steps.

Figure 5:
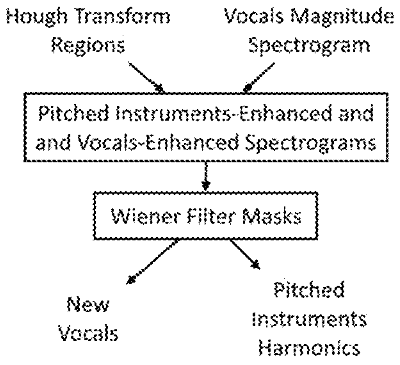
FIG. 5 is a block diagram demonstrating the two main steps in removing the pitched instruments harmonics from the vocals using adaptive median filtering.

FIG. 5 is a block diagram demonstrating the two main steps in removing the pitched instruments harmonics from the vocals using adaptive median filtering. Firstly, for each region $r^q$, median filters are used to generate pitched instrument—enhanced regions $H^q$ and vocals-enhanced regions $V^q$.

$$H^q = MD_h\{S_v, r^q, d_h\} \tag{8}$$

$$V^q = MD_v\{S_v, r^q, d_v^q\} \tag{9}$$

wherein $MD_h$ is the horizontal median filter with a fixed length $d_h$, applied for each frequency slice in the region $r^q$ of the magnitude spectrogram $S_v$, and $MD_v$ is the vertical median filter with an adaptive length $d_v^q$ applied for each time frame in the region $r^q$. In order to ensure complete removal of the rectangular region from the separated voice, $d_h$ was set to 0.1 sec. On the other side, $d_v^q$ changes according to the bandwidth of the rectangular region and is calculated as $$d_v^q = y_2^q - y_1^q \tag{10}$$

The pitched instrument—enhanced spectrogram H is formed as an all zeros I×J matrix except at Hough regions $r^q$ where it equals to $H^q$ respectively. On the other side, the vocals-enhanced spectrogram V is an all ones I×J matrix except at Hough regions $r^q$ where it equals to $V^q$ respectively.

Secondly, Wiener filter masks $M_H$ and $M_V$ are generated from H and V as denoted in equations (11) and (12) wherein square operation is applied element-wise.

$$M_H = \frac{H^2}{H^2 + V^2} \tag{11}$$

$$M_V = \frac{P^2}{H^2 + V^2} \tag{12}$$

These generated Wiener filter masks are then multiplied (element-wise) by the original complex spectrogram of the separated vocals $\hat{S}_v$ to produce complex spectrograms of the pitched instruments and voice respectively $\hat{H}$, $\hat{V}$ as equated in equations (13) and (14).

$$\hat{H}=\hat{S}_v \otimes M_H \quad (13)$$

$$\hat{V}=\hat{S}_v \otimes M_V \quad (14)$$

These complex spectrograms $\hat{H}$, $\hat{V}$ are then inverted back to the time domain to yield the separated pitched instruments harmonics and new vocals waveforms h and v respectively. The former is added to the music signal separated from the reference algorithm $s_m$ to form the new separated music signal m.

$$m=s_m+h \quad (15)$$

Figure 6:
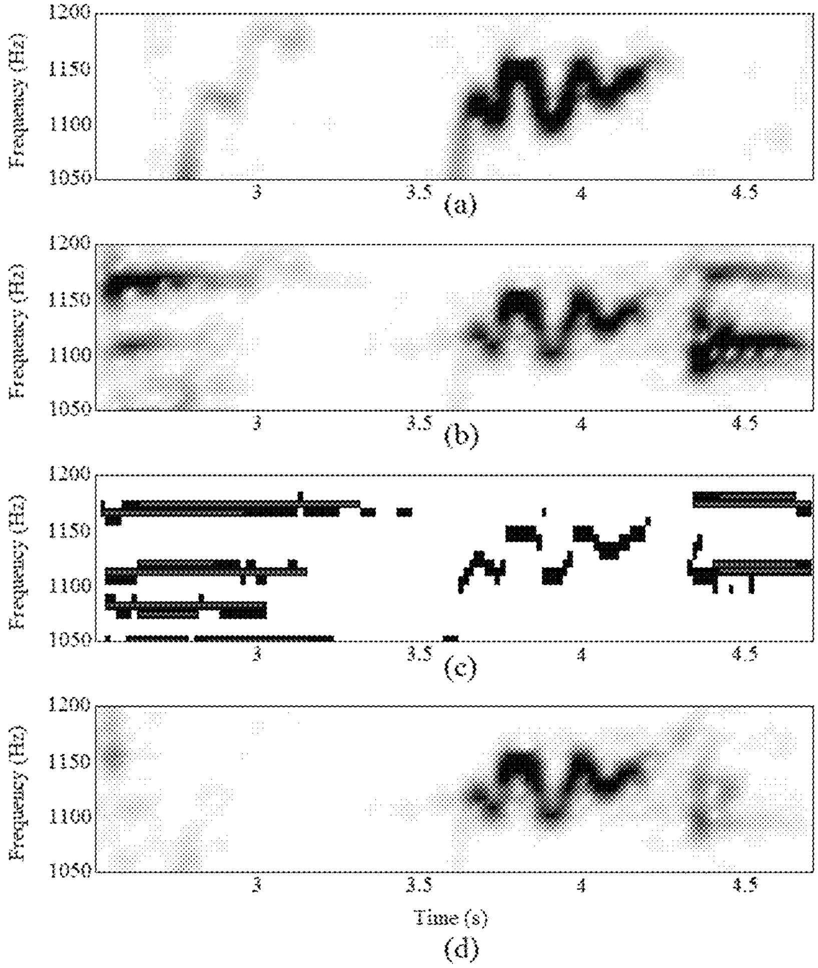
FIG. 6 overall demonstrates the process of removing harmonic instrument harmonics in accordance with the present system.

In order to demonstrate the effect of using the system in accordance with the present invention, diagonal median filtering algorithm was used as the reference separation algorithm, along with a song clip from MIR-1K data set. FIG. 6 (*c*) demonstrates the binary image generated from the mixture signal and the horizontal lines generated from Hough Transform while FIG. 6 (*d*) shows the new vocals spectrogram wherein pitched instruments harmonics are removed.

FIG. 6 overall demonstrates the process of removing pitched instruments harmonics in accordance with the present system. FIG. 6 also denotes by an example the effect of using the system in accordance with the present invention, along with diagonal median filtering algorithm as the reference separation algorithm, and the "Kenshin_1_01" song clip from the MIR-1K data set. Spectrograms are obtained with a window size of 2048 samples and 25% overlap as in FIG. 3. The original singing voice followed by the separated voice from Diagonal Median Filtering are shown in FIGS. 6 (*a*) and (*b*). The binary image generated from the mixture signal and the horizontal lines generated from Hough Transform are shown in FIG. 6 (*c*). The present system then determines locations of pitched instrument harmonics that are to be removed and the new voice is formed as shown in FIG. 6 (*d*).

The MIR-1K dataset was used to evaluate the effectiveness of the proposed system. The voice and music signals were linearly mixed with equal energy to generate the mixture signal. The mixture signal and the vocals separated from the reference separation algorithm were converted to a spectrogram with window size of 2048 samples and 25% overlap. In order to obtain the binary image, the spectrogram image is divided into smaller overlapping regions. Each region has a time span of 1 sec and frequency span of 400 Hz. The overlap between regions was 20% in time and frequency axes. For each region, the first binary image was calculated using a global threshold of $T_g$=0.1. The second binary image was calculated with Bernsen local thresholding using a rectangular neighborhood of 71×71 pixels. The third binary image however was calculated from peaks per frame where the minimum peak-to-peak distance was 20 Hz. The final binary image was built from the overlapping regions binaries with the "or" operator.

Hough lines are calculated from small overlapping regions as well. Each region had a time span of 1 sec and a frequency span of 400 Hz with 20% overlap. Hough horizontal lines were calculated for frequencies above 825 Hz since below this frequency, and in many cases, the vocal formants had long horizontal parts that resemble pitched instruments harmonics, and thus were mistakenly classified as pitched instruments. For each region, the number of Hough peaks was 40 and only Hough lines with a minimum length of 10 pixels (~0.16 sec.) were considered. Overlapping Hough lines from different regions were combined together before being used to generate Hough regions.

Figure 7:
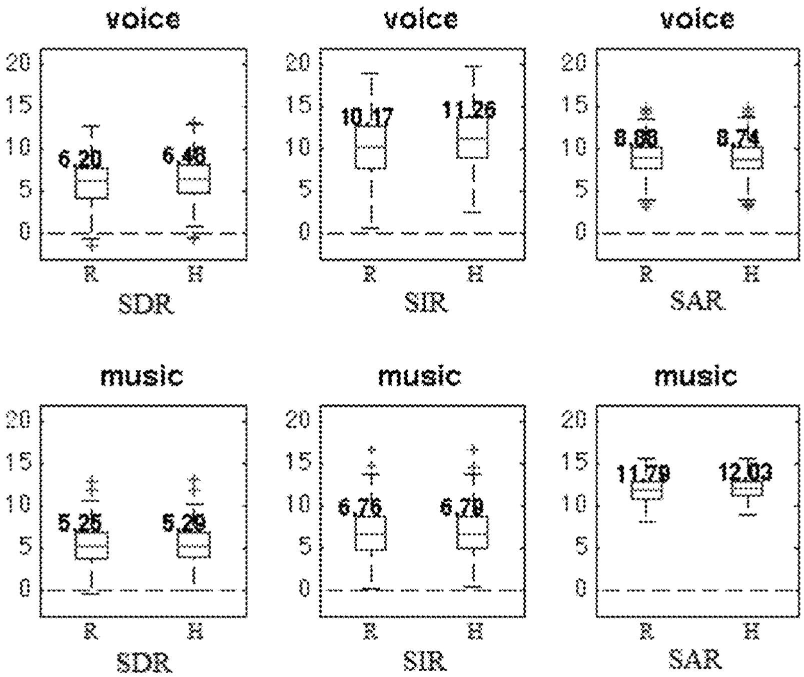
FIG. 7 shows box plots for the voice metrics of the reference separation algorithm before and after applying the Hough Transform based system.

On an experimental basis, diagonal median filtering algorithm with all its parameters was initially used as the reference separation algorithm. FIG. 7 shows box plots for the voice metrics of the reference separation algorithm before and after applying the Hough Transform based system. It is clearly shown that all metrics values have increased except for the voice artifacts. This means that the overall separation performance has improved for both singing voice and music. The greatest improvement is in the voice source-to-interference ratio (SIR), which is an indication that the present system considerably reduces the interference from pitched instruments on the separated voice. The separation performance for singing voice and music indicated by the SDR (left), SIR (middle), and SAR (right) metrics obtained using the BSS_EVAL toolbox. Considering FIG. 7, two boxplots are shown for each metric wherein the leftmost one (R) is for the reference separation algorithm prior to applying the present system, and the second one (H) is subsequent to applying the present system. Median values are also displayed.

Additionally, global normalized source-to-distortion ratio (GNSDR) was used to measure the overall quality of the separated voice and music from different reference algorithms before and after using the present system. The GNSDR is a common method used in many separation algorithms. It is defined as the average of the NSDR of all clips weighted by their lengths $w_n$.

$$GNSDR(\hat{s}, x, s) = \frac{\sum_{n=1}^{N} w_n NSDR(\hat{s}, x, s)}{\sum_{n=1}^{N} w_n} \quad (16)$$

wherein ŝ, x, and s denote the estimated source, the input mixture, and the target source, respectively. The normalized source-to-distortion ratio (NSDR) is the improvement of the SDR between the mixture x and the estimated source ŝ

$$\mathrm{NSDR}(\hat{s},x,s)=\mathrm{SDR}(\hat{s},s)-\mathrm{SDR}(x,s) \quad (27)$$

and wherein SDR is the source-to-distortion ratio calculated for each source as $$SDR(\hat{s}, s) = 10\log_{10}\frac{\langle \hat{s}, s\rangle^2}{\|\hat{s}\|^2\|s\|^2 - \langle \hat{s}, s\rangle^2} \quad (38)$$

The table below shows the results for many reference separation algorithms, namely; the diagonal median filtering (DMF) algorithm, the harmonic-percussive with sparsity constraints (HPSC), robust principal component analysis (RPCA), adaptive REPET (REPET+), two-stage NMF with local discontinuity (2NMFLD), and deep recurrent neural networks (DRNN). The following table displays GNSDR improvements for various Reference Algorithms:

| Reference Algorithm | Voice before | Voice after | Music before | Music after |
|---|---|---|---|---|
| DMF+H | 4.7075 | 4.9663 | 4.7293 | 4.9505 |
| HPSC+H | 4.2036 | 4.3933 | 3.9979 | 4.1631 |
| RPCA+H | 3.4590 | 3.6732 | 2.7167 | 3.1141 |
| REPET+ | 2.8485 | 3.2546 | 2.3699 | 3.0282 |
| 2NMF-LD+H | 2.2816 | 2.6146 | 2.9514 | 3.4494 |
| DRNN | 6.1940 | 6.2318 | 6.2006 | 6.2679 |

A high-pass filter with a cut-off frequency of 120 Hz was used as a post-processing step in most separation algorithms except for adaptive REPET (REPET+) where it did not improve results and for deep recurrent neural networks (DRNN) since it is a supervised (trained) approach and does not require a high pass filter. We also removed the clips used in training the deep recurrent neural networks (DRNN) from the testing dataset. Additionally, since the greatest improvement shown by the first experiment was the voice SIR, the singing voice global source-to-interference ratio (GSIR) was also calculated, which is the weighted mean of the voice SIR of all clips. The following table displays voice GSIR improvements for various Reference Algorithms:

| Reference Algorithm | Voice before | Voice after |
|---|---|---|
| DMF+H | 10.2083 | 11.4141 |
| HPSC+H | 7.1059 | 7.6443 |
| RPCA+H | 8.6360 | 9.2991 |
| 2NMF-LD+H | 7.7299 | 8.8735 |
| REPET+ | 5.2733 | 6.0682 |
| DRNN | 13.1780 | 13.6295 |

Results show that the present system in accordance with the present invention improves the quality of separation for all reference algorithms used, even for the supervised systems (DRNN), which is an indication to its wide applicability. Further, the results suggest that the diagonal median filtering approach when combined with the Hough Transform based system has the best separation quality over all blind or unsupervised separation algorithms.

Many changes, modifications, variations and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims which follow.

The invention claimed is:

1. A method for improving singing voice separation from monaural music recordings, the method comprising:
   - using Hough transform to detect traces of pitched instruments in a magnitude spectrogram of a voice separated from the monaural music recordings; and
   - removing the detected traces of pitched instruments using adaptive median filtering to improve a quality of the voice separated from the monaural music recordings and to form a new separated music signal.

2. The method of improving singing voice separation of claim 1, wherein the method further comprises:
   - generating the magnitude spectrogram of a mixture signal, wherein the mixture signal is a segment of the monaural music recording;
   - converting the magnitude spectrogram to a grey scale image;
   - applying a plurality of binarization steps to the grey scale image to generate a final binary image;
   - applying Hough transform to the final binary image;
   - identifying horizontal ridges represented by Hough lines and calculating variable frequency bands of the identified horizontal ridges;
   - calculating rectangular regions denoted here as Hough regions;
   - generating a vocal spectrogram from vocal signals separated using a reference separation algorithm;
   - applying adaptive median filtering techniques to remove the identified Hough regions from the vocal spectrogram producing separated pitched instruments harmonics and a new vocal signal;
   - adding the separated pitched instruments harmonics to a music signal separated using the reference separation algorithm to form the new separated music signal.

3. The method of claim 2 wherein the binarization steps are performed through a combination of global and local thresholding techniques followed by extraction of peaks inside time frames.

4. The method of claim 1 wherein the method works as a post processing step that when applied to a separation algorithm, improves separation quality.

5. A system for improving singing voice separation from monaural music recordings, the system comprising a microprocessor for:
   - using Hough transform to detect traces of pitched instruments in a magnitude spectrogram of a voice separated from the monaural music recordings; and
   - removing the detected traces of pitched instruments using adaptive median filtering to improve a quality of the voice separated from the monaural music recordings and to form a new separated music signal.

6. The system for improving singing voice separation of claim 5, wherein the system further comprises:
   - generating the magnitude spectrogram of a mixture signal, wherein the mixture signal is a segment of the monaural music recording;
   - converting the magnitude spectrogram to a grey scale image;
   - applying a number of binarization steps to the grey scale image to generate a final binary image;
   - implementing Hough transform to the final binary image;
   - identifying horizontal ridges represented by Hough lines and calculating variable frequency bands of the identified horizontal ridges;
   - calculating rectangular regions denoted here as Hough regions;
   - generating a vocal spectrogram from vocal signals separated using a separation algorithm;
   - applying adaptive median filtering techniques to remove the identified Hough regions from the vocal spectrogram producing separated pitched instruments harmonics and new vocals harmonics;
   - adding the separated pitched instruments harmonics to a music signal separated using the separation algorithm to form the new separated music signal.

* * * * *